(12) United States Patent
Twitchen et al.

(10) Patent No.: US 9,068,257 B2
(45) Date of Patent: Jun. 30, 2015

(54) DIAMOND MATERIAL

(75) Inventors: Daniel James Twitchen, Berkshire (GB); Sarah Louise Geoghegan, Berkshire (GB); Neil Perkins, Berkshire (GB)

(73) Assignee: Element Six Technologies Limited (GB)

( * ) Notice: Subject to any disclaimer, the term of this patent is extended or adjusted under 35 U.S.C. 154(b) by 336 days.

(21) Appl. No.: 12/823,526

(22) Filed: Jun. 25, 2010

(65) Prior Publication Data

US 2010/0326135 A1 Dec. 30, 2010

Related U.S. Application Data

(60) Provisional application No. 61/220,663, filed on Jun. 26, 2009, provisional application No. 61/247,735, filed on Oct. 1, 2009, provisional application No. 61/310,639, filed on Mar. 4, 2010, provisional application No. 61/320,023, filed on Apr. 1, 2010, provisional application No. 61/332,878, filed on May 10, 2010.

(51) Int. Cl.

| | |
|---|---|
| *C23C 16/27* | (2006.01) |
| *A44C 17/00* | (2006.01) |
| *C23C 16/56* | (2006.01) |
| *C30B 25/10* | (2006.01) |
| *C30B 29/04* | (2006.01) |
| *C30B 31/20* | (2006.01) |

(52) U.S. Cl.
CPC ............ *C23C 16/278* (2013.01); *A44C 17/008* (2013.01); *C23C 16/27* (2013.01); *C23C 16/56* (2013.01); *C30B 25/105* (2013.01); *C30B 29/04* (2013.01); *C30B 31/20* (2013.01)

(58) Field of Classification Search
None
See application file for complete search history.

(56) References Cited

U.S. PATENT DOCUMENTS

| | | | |
|---|---|---|---|
| 2,945,793 | A | 7/1960 | Dugdale |
| 4,959,201 | A | 9/1990 | Satoh et al. |
| 5,451,430 | A | 9/1995 | Anthony et al. |
| 5,672,395 | A | 9/1997 | Anthony et al. |
| 6,030,595 | A | 2/2000 | Sumiya et al. |
| 7,122,837 | B2 | 10/2006 | Linares et al. |
| 7,160,671 | B2 | 1/2007 | Ko et al. |
| 7,172,655 | B2 | 2/2007 | Twitchen et al. |

(Continued)

FOREIGN PATENT DOCUMENTS

| | | |
|---|---|---|
| EP | 0 275 063 A2 | 11/1988 |
| EP | 0 316 856 A1 | 11/1988 |

(Continued)

OTHER PUBLICATIONS

De Weerdt et al, "Defects in coloured natural diamonds," Diamond and Related Materials, 10, 2001, pp. 474-479.

(Continued)

*Primary Examiner* — Guinever Gregorio
(74) *Attorney, Agent, or Firm* — Bryan Cave LLP

(57) ABSTRACT

A method of making fancy orange synthetic CVD diamond material is described. The method comprises irradiating a single crystal diamond material that has been grown by CVD to introduce isolated vacancies into at least part of the CVD diamond material and then annealing the irradiated diamond material to form vacancy chains from at least some of the introduced isolated vacancies. Fancy orange CVD diamond material is also described.

5 Claims, 3 Drawing Sheets

(56) References Cited

U.S. PATENT DOCUMENTS

| | | | |
|---|---|---|---|
| 7,964,280 | B2 | 6/2011 | Williams et al. |
| 2004/0175499 | A1* | 9/2004 | Twitchen et al. .......... 427/249.8 |
| 2004/0194690 | A1 | 10/2004 | Twitchen et al. |
| 2004/0229464 | A1 | 11/2004 | Godfried et al. |
| 2005/0181131 | A1 | 8/2005 | Linares et al. |
| 2006/0292302 | A1 | 12/2006 | Chodelka et al. |
| 2007/0053823 | A1 | 3/2007 | Vins |
| 2007/0092647 | A1 | 4/2007 | Scarsbrook et al. |
| 2008/0241049 | A1 | 10/2008 | Hemley et al. |
| 2010/0028556 | A1 | 2/2010 | Linares et al. |
| 2010/0104494 | A1 | 4/2010 | Meng et al. |

FOREIGN PATENT DOCUMENTS

| | | |
|---|---|---|
| EP | 0 615 954 A1 | 8/1994 |
| EP | 0 671 482 A1 | 3/1995 |
| EP | 1 990 313 A1 | 10/2007 |
| GB | 2 430 194 A | 5/2003 |
| GB | 743584 A | 3/2007 |
| JP | 2 571 797 B2 | 11/1987 |
| JP | 62296875 | 11/1987 |
| JP | 2 184 600 A | 1/1989 |
| JP | 01-138112 A | 5/1989 |
| JP | 2 000 385 | 1/1990 |
| KR | 10-2008-0089734 A | 10/2008 |
| WO | 99 67171 | 12/1999 |
| WO | 01 96633 A1 | 12/2001 |
| WO | 01 96634 A1 | 12/2001 |
| WO | 03 014427 A1 | 2/2003 |
| WO | 03 052177 A1 | 6/2003 |
| WO | 2004 022821 A1 | 3/2004 |
| WO | 2004 046427 A1 | 3/2004 |
| WO | 2007 009037 A1 | 1/2007 |
| WO | 2010 010344 A1 | 1/2010 |
| WO | 2010 010352 A1 | 1/2010 |

OTHER PUBLICATIONS

G. Davies, "Current problems in diamond: towards a quantitative understanding," Physica B. 273-274, 1999, pp. 15-23.

King, et al., "Color grading of colored diamonds in the GIA gem trade laboratory," Gems & Gemology, vol. 30, No. 4, 1994, pp. 220-242.

P. Von Fritz, "Uber Brechungsindizes und Absorptionskonstanten des Diamanten zwischen 644 und 288 mu1).," Z. Phys. 15, 1923, pp. 358-368.

Howarth, et al., "Generalization of the lineshape useful in magnetic resonance spectroscopy," J. Magn. Res., 161, 2003, pp. 215-221.

Hyde, et al., "Pseudo Field Modulation in EPR Spectroscopy," Appl. Magn. Reson., 1, 1990, pp. 483-496.

Wyszecki, et al., "Color Science Concepts and Methods, Quantitative Data and Formulas," New York; London-Sydney, 1967, pp. 9, 242-251.

Commission Internationale de L'Eclairage, "Colorimetry," 1986, pp. 27-33.

Pagel-Theisen et al., "Diamond Grading ABC The Manual," Rubin & Son, Belgium, 9th Edition, 2001, pp. 64-67.

Bradlow et al., "Asymmetry of the GR1 line in type IIA diamond," Solid State Communications, vol. 38, 1981, pp. 247-249.

Collins et al., "The annealing of radiation damage in De Beers colourless CVD diamond," Diamond and Related Materials, vol. 3, No. 4-6, 1994, pp. 932-935.

Fritsch, et al., "Thermochromic and photochromic behavior of "chameleon" diamonds," Diamond and Related Materials, vol. 16, 2007, pp. 401-408.

Kennedy, et al., "Long coherence times at 300 K for nitrogen-vacancy center spins in diamond grown by chemical vapor deposition," Applied Physics Letters, vol. 83, No. 20, 2003, pp. 4190-4192.

Nelder, et al., "A simplex method for function minimization," The Computer Journal, 7, 1965, pp. 308-313.

Walderman et al., "Creating diamond color centers for quantum optical applications," Diamond and Related Materials, vol. 16, 2007, pp. 1887-1895.

J. Walker, "Optical absorption and luminescence in diamond," Rep. Prog. Phys 1979, 42, pp. 1605-1659.

Wang, "CVD Grown Pink Diamonds," GIA Laboratories, Apr. 2009, pp. 1-3.

PCT Search Report for PCT/EP2010/059078 dated Sep. 27, 2010.
PCT Search Report for PCT/EP2010/059080 dated Aug. 26, 2010.
PCT Search Report for PCT/EP2010/059081 dated Sep. 22, 2010.
PCT Search Report for PCT/EP2010/059084 dated Sep. 20, 2010.
Search Report for GB1005573.9 dated Jul. 29, 2010.
Search Report for GB0911075.0 dated Oct. 29, 2009.
Search Report for GB1003613.5 dated Jun. 30, 2010.

Stesmans et al., "Chemical Vapour Deposition Diamond Studied by Optical and Electron Spin Resonance Techniques," J. Physics; Condes. Matter; vol. 14, 2002, pp. R467-R499.

McLaren, et al., The Derivation of Hue-Difference Terms from CIELAB Coordinates, Color Research and Application, vol. 6(2), pp. 75-77, 1981.

* cited by examiner

DIAMOND MATERIAL

BACKGROUND OF THE INVENTION

This invention relates in general to a method of making a fancy orange single crystal diamond material by post-growth treatment of a diamond material that has been grown by a CVD (chemical vapor deposition) process, and to CVD single crystal diamond material which is fancy orange in color.

The term "fancy-colored diamond" is a well-established gem trade classification and is used to refer to unusual colored diamonds. A useful history and background to the grading of fancy colored diamond gemstones, including the use of Munsell color charts is given by King et al, in Gems & Gemology, Vol. 30, No. 4, 1994 (pp. 220-242).

Examples of fancy colored synthetic and natural diamonds made by introducing color centers into the diamond are known in the prior art. For example, EP0615954A and EP0316856A describe irradiation of synthetic diamond material with an electron beam or a neutron beam to form lattice defects (interstitials and isolated vacancies) in the crystal. Thereafter the diamond crystal is annealed in a prescribed temperature range to form color centers. Neither of these publications discloses orange diamond material.

Another publication describing the formation of fancy colored diamond material is "Optical Absorption and Luminescence" by John Walker in "Reports on Progress in Physics", Volume 42, 1979. That publication similarly describes the steps of forming lattice defects in crystals by electron beam irradiation, and if necessary annealing to cause the lattice defects to combine with nitrogen atoms contained in the crystals. There is no disclosure of orange diamond material in this publication.

US 2004/0175499 (Twitchen et al) describes a method starting with a colored CVD diamond, usually brown or near-brown, and applying a prescribed heat treatment to produce another and desirable color in the diamond. The prior art reference notes that the relative strengths of the absorption bands in the visible region of the spectrum of brown single crystal CVD diamond can be altered by annealing, with concurrent changes in the Raman spectrum, and that changes in the absorption spectrum are observed at much lower temperatures than are required to alter the color of brown natural diamond. Significant color changes are said to be achieved by annealing at atmospheric pressure in an inert atmosphere at temperatures of 1600° C. or less. One example describes a grown CVD diamond polished into a round brilliant of 0.51 carat that was graded as light brown. After annealing at 1700° C. for 24 hours it was graded as light orangish pink. Another example describes a grown CVD diamond slice which had an orange brown color, and after annealing this color becomes colorless. A further example describes a grown CVD diamond layer polished into a rectangular cut gemstone of 1.04 carats which is graded fancy dark orangey brown color. After annealing at 1600° C. for four hours this becomes a fancy intense brownish pink color.

SUMMARY OF THE INVENTION

Embodiments of a method for making diamond material with an orange color, and orange diamond material per se are disclosed. Amongst these embodiments, we have found that a fancy orange color can be introduced into synthetic CVD diamond material by irradiating synthetic CVD diamond material for a time sufficient to introduce a specified concentration of isolated vacancies into the diamond material, and then annealing that isolated-vacancy-containing CVD diamond material for a sufficiently long time at a low temperature to produce a fancy orange colored diamond material. Without limiting the invention in any way it is thought that during the low temperature anneal at least some of those isolated vacancies are converted into vacancy chains in the CVD diamond material and that the vacancy chains are responsible for the perceived fancy orange color of the diamond material.

DETAILED DESCRIPTION OF THE INVENTION

A first aspect of the invention provides a method of making fancy orange synthetic CVD diamond material, the method comprising: (i) providing a single crystal diamond material that has been grown by a CVD process and has a $[N_s^0]$ concentration less than 5 ppm; (ii) irradiating the provided CVD diamond material so as to introduce isolated vacancies V into at least part of the provided CVD diamond material such that the total concentration of isolated vacancies $[V_T]=([V^0]+[V^-])$ in the irradiated diamond material is at least the greater of (a) 0.5 ppm and (b) 50% higher than the $[N_s^0]$ concentration in ppm in the provided CVD diamond material, and (iii) annealing the irradiated diamond material at a temperature of at least 700° C. and at most 900° C. for a period of at least 2 hours, optionally at least 4 hours, optionally at least 8 hours thereby forming vacancy chains from at least some of the introduced isolated vacancies.

According to the first aspect of the invention, the total concentration of isolated vacancies $[V_T]=([V^0]+[V^-])$ in the irradiated diamond material is at least the greater of (a) 0.5 ppm and (b) 50% higher than the $[N_s^0]$ concentration in ppm in the provided CVD diamond material. This means that the total concentration of isolated vacancies $[V_T]=([V^0]+[V^-])$ always has a minimum value of 0.5 ppm even for low or zero $[N_s^0]$ concentrations in the provided CVD diamond material. Above $[N_s^0]$ concentrations in the provided CVD diamond material of about 0.33 ppm the minimum value of the concentration of isolated vacancies $[V_T]=([V^0]+[V^-])$ in the irradiated diamond material is given by calculating 50% higher than the $[N_s^0]$ concentration in ppm in the provided CVD diamond material, since that will result in a value for the concentration of isolated vacancies $[V_T]=([V^0]+[V^-])$ greater than 0.5 ppm.

In some embodiments according to the invention the irradiation and annealing steps are carried out so as to reduce the concentration of isolated vacancies, $[V_T]$ to a concentration of <0.3 ppm.

Fancy orange colored diamond material made by the method according to the present invention may be used as gemstones. Other applications, for example use as a color filter or cutting tool for example a scalpel are also envisaged.

The CVD diamond prior to the irradiation step is referred to sometimes in this specification as "the provided CVD diamond". The step of actually growing the CVD diamond material may or may not form part of the method of embodiments of the invention. Providing a CVD diamond material may simply mean, for example, selecting a pre-grown CVD diamond material. The diamond material after irradiation step (i) is referred to as the "irradiated diamond", and the diamond material after the irradiation and annealing step is referred to as the "treated diamond material" or as the "irradiated and annealed diamond material". Steps (i) to (ii) of embodiments of methods of the present invention, describing the diamond material at each stage of the method are illustrated in the flow diagram of FIG. 1.

The provided CVD diamond material in the method of the present invention has a $[N_s^0]$ concentration (that is a concentration of neutral single substitutional nitrogen defects) less than 5 ppm, optionally less than 4 ppm, optionally less than 3 ppm, optically less than 2 ppm, optionally less than 1 ppm. The color of the provided CVD diamond material may vary according to the $[N_s^0]$ concentration, and the manner in which the diamond material has been grown. It is known that $[N_s^0]$ defects themselves introduce a yellow coloration into diamond material, particularly at concentrations greater than 0.3 ppm, but the skilled person will recognize that the observation of color is related to both the concentration and the optical path length through the diamond. It is also known that the presence of the low concentrations of nitrogen in a CVD growth environment can affect the nature and concentration of other defects that are incorporated in a CVD synthetic diamond material as the diamond material grows, and that at least some of these other defects provide color centers contribute to the color of CVD diamond material, typically introducing a brown coloration to the diamond material. All measurements to calculate the concentration of $N_s^0$ are done following UV excitation.

It is thought that the color centers that contribute to the brown coloration of CVD diamond grown in the presence of low concentrations of nitrogen are unique to single crystal CVD diamond, or to pieces cut or produced from layers of single crystal CVD diamond. It is furthermore known that the color centers contributing to brown coloration in CVD diamond are different from those contributing to any brown coloration observed in natural diamond because the defects in the CVD diamond material cause absorption bands in the absorption spectra of the grown CVD diamond material that are not found in the absorption spectra of natural diamond. Evidence for this comes from Raman scattering from non-diamond carbon observable with an infrared excitation source (e.g. 785 nm or 1064 nm) which is not observed for brown natural diamond. Further, it is known that these color centers in natural diamond material anneal at a different temperature to those in CVD diamond material.

It is believed that some of the color centers contributing to the brown coloration seen in CVD synthetic diamond grown in processes in which low concentrations of nitrogen are introduced relate to localized disruption of the diamond bonding within the single crystal CVD diamond. The exact nature of the defects is not fully understood, but the use of electron paramagnetic resonance (EPR) and optical absorption spectroscopy techniques have been used to study the nature of the defects and improve our understanding somewhat. The presence of the nitrogen in the grown CVD synthetic diamond material can be evidenced by looking at absorption spectra for the grown CVD diamond material, and analysis of these spectra gives some indication of the relative proportions of different types of defect present. A typical spectrum for grown CVD synthetic diamond material grown with nitrogen added to the synthesis environment shows a peak at about 270 nm, which is generated by the presence of neutral single substitutional nitrogen ($N_s^0$) atoms in the diamond lattice. Additionally peaks have been observed at about 350 nm and approximately 510 nm corresponding to other defects characteristic and unique to CVD synthetic diamond material, and furthermore a so-called "ramp", that is a rising background of the form $c \times \lambda^{-3}$ has been observed, where c is a constant and $\lambda$ is the wavelength. While the $N_s^0$ is primarily identifiable by its peak at 270 nm, it also contributes in smaller amounts to the absorption spectrum at higher wavelengths, in particular at wavelengths in the visible part of the spectrum, which is generally considered to cover the wavelength range 350 nm to 750 nm.

It is the combination of features evident in the visible part of the absorption spectrum of the CVD diamond material, i.e. (a) the $N_s^0$ contribution in the visible part of the spectrum, (b) the 350 nm peak, (c) the 510 nm peak and (d) the ramp feature, that affect the perceived color of the diamond material and are believed to be responsible for the brown color typically seen in nitrogen doped CVD synthetic diamond material. The peaks at 350 nm and 510 nm, are not seen in the absorption spectra of natural diamonds, nor in the absorption spectra of other synthetic diamonds, for example synthetic HPHT diamonds of the type described in EP615954A. For the purposes of this specification, all defects other than the $N_s^0$ defects that contribute to the absorption spectrum in the visible part of the spectrum, which we have discussed above as the 350 nm, 510 nm and ramp features, will be referred to collectively as "X defects". As noted above, at this time the structural nature of these defects at an atomic level is not understood, merely their effect on the grown diamond material's absorption spectra. Without binding the invention in any way, it is thought that the nature of the defects responsible for the brown coloration might be related to the presence of multi-vacancy clusters (each cluster being made up of tens of vacancies e.g. 30 or 40 vacancies or more) that are grown-in under large growth rates, concomitant with the addition of nitrogen to the plasma to a hydrogen/methane ($H_2/CH_4$) source gas. Such clusters are thermally unstable and may be removed to some degree, by high-temperature treatment (i.e. annealing). It is thought that smaller vacancy-related defects, such as a NVH (nitrogen-vacancy-hydrogen) defects that are made up of nitrogen and hydrogen and a missing carbon atom, may be partially responsible for the brown color and these defects may also be removed by high-temperature treatment.

In certain methods according to the invention, the absorption coefficients at 350 nm and 510 nm for the provided diamond material are less than 3 $cm^{-1}$ and 1 $cm^{-1}$ respectively, optionally less than 2 $cm^{-1}$ and 0.8 $cm^{-1}$ respectively.

Depending on the method of manufacture, and the $[N_s^0]$ concentration in the as-grown CVD diamond material, the provided CVD diamond material used in methods according to the invention may typically appear colorless, near colorless, or yellow or brown with weak to medium saturation C* and very light to medium lightness L* (C* and L* are discussed in detail later in this specification). The $[N_s^0]$ concentration in the provided diamond material is less than 5 ppm, which limits any yellow coloration of the diamond material. For certain embodiments according to the invention the absorption coefficient at 350 nm and 510 nm are less than 3 $cm^{-1}$ and 1 $cm^{-1}$ respectively, optionally less than 2 $cm^{-1}$ and 0.8 $cm^{-1}$ respectively, the absorption coefficients at these wavelengths being a measure of the brownness of the diamond material since the X defects are thought to be responsible for much of the brown coloration due to above-mentioned X defects in diamond material grown by a CVD process incorporating nitrogen in the source gas.

According to different embodiments of methods according to the present invention, the provided CVD diamond may or may not contain $N_s^0$. Where it does contain $N_s^0$, the concentration of $[N_s^0]$ present in the synthetic CVD diamond material of the present invention may be measured using EPR for levels $<5 \times 10^{15}$ $cm^{-3}$ and using UV visible optical absorption techniques for higher concentrations. These techniques are applied to samples post exposure to UV light.

$[N_s^0]$ in the neutral charge state content can be measured by using electron paramagnetic resonance (EPR). Whilst the method is well-known in the art, for completeness it is summarized here. In measurements conducted using EPR, the abundance of a particular paramagnetic defect (e.g. the neutral single-substitutional nitrogen defect) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimize the errors associated with double integration, base line correction, finite limits of integration, etc., especially in cases where overlapping EPR spectra are present, a spectral fitting method (using a Nelder-Mead simplex algorithm (J. A. Nelder and R. Mead, The Computer Journal, 7 (1965), 308)) is employed to determine the integrated intensity of the EPR centers present in the example of interest. This entails fitting the experimental spectra with simulated spectra of the defects present in the example and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsallis line shape in order to produce a good fit to the recorded EPR spectra (J. S. Hyde, M. Pasenkiewicz-Gierula, A. Jesmanowicz, W. E. Antholine, Appl. Magn. Reson., 1 (1990), 483). Using this method the concentration in ppm can be determined with a reproducibility of better than ±5%.

The technique of UV-visible absorption spectroscopy for measuring higher $[N_s^0]$ concentrations is well-known in the art, and involves measurements using the 270 nm peak of the absorption spectrum of the diamond material.

The provided diamond material according to the present invention may be grown using a conventional CVD process, for example of the type disclosed in WO 03/052177. Such a process, as noted above may result in a diamond material having some brown coloration, but providing this brown coloration is not too strong, it can be masked by the introduced orange coloration resulting from the post growth irradiation and annealing treatment of the method of the present invention.

Another CVD growth process that may be used to produce the provided CVD diamond material is a CVD growth process in which the source gas contains carbon, hydrogen, nitrogen and oxygen, rather than the more usual carbon hydrogen and nitrogen. For example, oxygen may be added to the process gas at a concentration of at least 10000 ppm in the gas phase. In particular, the provided CVD diamond material in step (i) of the method according to the first aspect of the invention may be grown directly by the process described in GB application number GB0922449.4 and U.S. provisional application number US Ser. No. 61/289,282 the entire disclosures of which are incorporated herein by reference. Specifically the method involves providing a substrate; providing a source gas; and allowing homoepitaxial diamond synthesis on the substrate; wherein the synthesis environment comprises nitrogen at an atomic concentration of from about 0.4 ppm to about 50 ppm; and wherein the source gas comprises: (a) an atomic fraction of hydrogen $H_f$, from about 0.4 to about 0.75; (b) an atomic fraction of carbon, $C_f$, from about 0.15 to about 0.3; (c) an atomic fraction of oxygen, $O_f$, from about 0.13 to about 0.4; wherein $H_f+C_f+O_f=1$; wherein the ratio of atomic fraction of carbon to the atomic fraction of oxygen $C_f:O_f$, satisfies the ratio of about $0.45:1<C_f:O_f<$about $1.25:1$; wherein the source gas comprises hydrogen atoms added as hydrogen molecules, $H_2$, at an atomic fraction of the total number of hydrogen, oxygen and carbon atoms present of between 0.05 and 0.4; and wherein the atomic fractions $H_f$, $C_f$ and $O_f$ are fractions of the total number of hydrogen, oxygen and carbon atoms present in the source gas. This method of growing CVD diamond material shall be referred to in the specification as the "added oxygen CVD growth process". It typically results (depending on the nitrogen concentration) in a provided CVD diamond material which is colorless, near colorless or has low brown coloration.

The color of the irradiated diamond material is a combination of the starting color, if any, of the provided diamond material and the orange color introduced by the irradiation and annealing steps to introduce vacancy chains. Other impurities that could introduce color into the provided diamond material may in certain embodiments be minimized. For example, uncompensated boron (isolated boron) may itself introduce a blue color to the diamond material. For some embodiments the atomic boron concentration [B] in the provided diamond material is less than $5 \times 10^{15}$ cm$^{-3}$.

It is known that if there is uncompensated boron in a diamond material this may be compensated for by irradiating to introduce isolated vacancies, the isolated vacancies combining with the boron so that neither the boron, nor those compensating isolated vacancies impart any color to the diamond material. Therefore in some embodiments according to the present invention, if the diamond material does contain uncompensated boron (for example in a concentration of $>5 \times 10^{15}$ cm$^{-3}$), then the irradiation step may be carried out so as to introduce sufficient isolated vacancies not only to compensate the boron but also to achieve the specified isolated vacancy concentration $[V_T]$. The level of additional irradiation needed for boron-compensation could be determined empirically by the person skilled in the art. Thus in some embodiments of method according to the invention, uncompensated boron is present in the provided diamond material in a concentration of $>5 \times 10^{15}$ cm$^{-3}$, and the irradiation step introduces sufficient isolated vacancies into the diamond material so that total concentration of isolated vacancies $[V_T]$ in the irradiated diamond material, after isolated vacancies have been used to compensate the boron, is at least the greater of 0.5 ppm or 50% higher than the $[N_s^0]$ concentration in ppm in the provided CVD diamond material. The level of additional irradiation needed for boron compensation could be determined empirically by the person skilled in the art. Total boron in the material may be quantified using techniques known to the skilled man. Secondary ion mass spectroscopy (SIMS) may be used for example to ascertain the total boron concentration. The uncompensated boron may be ascertained using either the induced absorption measured in the infrared part of the diamond spectrum, or through Hall or electrical transport measurements, in a manner known to the skilled person.

Typically the $[N_s^0]$ concentration in ppm in the provided CVD diamond material will remain substantially unchanged by the irradiation step (step (ii) of methods according to the invention). It will be changed by the annealing step (step (iii) of methods according to the invention, as explained later in this specification.

The provided CVD diamond material used in the method according to the first aspect of the present invention optionally may have at least about 50%, alternatively at least about 80%, alternatively at least about 90%, alternatively at least about 95% of the volume of the synthetic CVD diamond material formed from a single growth sector. This single growth sector is optionally a {100} or a {110} growth sector. The material of the single growth sector optionally has $N_s^0$ levels within ±10% of the mean for greater than about 50% of the volume of the growth sector, alternatively greater than about 60% of the volume of the growth sector, alternatively greater than about 80% of the volume of the growth sector. Using a provided synthetic CVD diamond material that has been grown from a single growth sector is advantageous as the CVD diamond material will have fewer surfaces with different crystallographic orientation (which are the surfaces corresponding to differing growth sectors). Surfaces with different crystallographic orientations exhibit strongly differential uptake of nitrogen impurity and a synthetic CVD diamond material comprising more growth sectors therefore tends to show more undesirable zones with different color, resulting from the different concentrations of $N_s^0$ in different growth sectors.

The color of a diamond material colored by using a post growth treatment method is the color of the diamond material prior to post growth treatment combined with the effect on color of any defect produced during the post growth treatment. According to the method of the present invention, we have found that if we apply a particular post-CVD-growth treatment we can introduce an orange color in to the diamond material. Small to moderate amounts of yellow or brown in the starting material may be tolerated and the treated diamond (post irradiation and anneal according to the invention) will still appear orange, since the orange coloration introduced by the post growth treatment has moderate to strong saturation (C* as hereinafter described), and medium to light lightness (L* as hereinafter described) and is therefore able to mask small to moderate amounts of yellow or brown in the provided CVD diamond. For certain embodiments according to the invention we start with a provided CVD diamond that has minimal or no color, i.e. is substantially colorless; for other embodiments according to the invention we start with a provided diamond material that has some color, usually some yellow or brownness. For example, for some embodiments, to produce a light orange diamond material, which has a low C* and/or high L* value, (e.g. C*<10, and/or L*>65) it would be necessary to start with a colorless or pale yellow material.

According to the method of the present invention, the irradiation step introduces a total isolated vacancy concentration $[V_T]$ which is at least the greater of (a) 0.5 ppm and (b) 50% higher than the $[N_s^0]$ concentration in the provided diamond material. The isolated vacancy concentration $[V_T]$ is given by the sum of $[V^0]$ and $[V^-]$, where $[V^0]$ is the concentration of isolated neutral vacancies, and $[V^-]$ is the concentration of negatively charged isolated vacancies, both in ppm. Both $[V^0]$ and $[V^-]$ concentrations are determined from the GR1 and ND1 absorption features of the absorption spectrum of the irradiated diamond in a manner described hereinafter. It is possible that said irradiation might introduce vacancies in other forms, e.g. as pairs or in possible isolated positive vacancies. The inventors did not observe any obvious features in the material that could be associated with such defects, but do not rule out this possibility. In certain embodiments according to the invention the total isolated vacancy concentration $[V_T]$ is more than the greater of (a) 0.5 ppm and (b) 50% higher than the $[N_s^0]$ concentration in the provided diamond material. For example the total isolated vacancy concentration $[V_T]$ may be at least 0.7 ppm, or at least 0.9 ppm, or at least 1.0 ppm greater than the $[N_s^0]$ concentration in the provided diamond material.

In general, the greater the irradiation dose, the greater the number of isolated vacancies created. The number of isolated vacancies can depend not only on the period of the irradiation dose but also on the number and nature of defects in the provided CVD diamond material. Therefore in order to calculate the desired dose of electronic radiation, the isolated vacancy production rate is also calculated for the given irradiation conditions, as will be known to those skilled in the art.

Factors such as diamond temperature, beam energy, beam flux, and even the starting diamond's properties can affect the $[V_T]$ produced for a fixed experimental irradiation set-up and time. Irradiation is typically carried out with the sample mounted under ambient conditions ~300 K with only minimal temperature rise during the irradiation dose (e.g. less than 100 K). However, factors such as beam energy and beam flux can lead to sample heating. Optionally the sample is held as cold as possible (with even cryogenic cooling at 77 K being advantageous under some circumstances) to enable high dose rates without compromising temperature control and thus minimize the irradiation time. This is advantageous for commercial reasons. Calibration of the dose applied against the vacancies produced for the particular provided diamond being used in order to satisfy these limits on $[V_T]$ concentration introduced will form part of the skilled person's responsibilities before carrying out the method of the present invention. Such calibration techniques are routine for the person skilled in the art.

A larger sample could be rotated and irradiated from two or more sides in order to introduce vacancies through the whole thickness of the diamond material.

Optionally the provided diamond material may be annealed in the temperature range 1400° C.-2500° C. prior to the first irradiation step.

Step (iii) of methods according to the invention comprises annealing irradiated diamond material at a temperature of at least 700° C. and at most 900° C. for a period of at least 2 hours. The effect that this annealing step has on the isolated vacancies in the irradiated diamond material depends on whether, and how many, $N_s^0$ defects are present in the irradiated diamond material. If there are $N_s^0$ defects in the diamond material, then initially annealing at 700° C. to 900° C. will form NV centers, each NV centre being the result of a $N_s^0$ defect joining with a single isolated vacancy. In this case, when $N_s^0$ defects are present, it is predominantly after the maximum number of NV centers has formed that vacancy chains start to form. However, not all $N_s^0$ defects are converted to NV centers, this being thought be due to the distribution of some of the $N_s^0$ defects. Once the concentration of NV centers have saturated out, any isolated vacancies that have not been used up to form NV centers are available to combine with each other to form vacancy chains. It is these vacancy chains that are thought to give the orange color in the treated diamond material according to the present invention. Therefore in methods according to the present invention the irradiation of the provided CVD diamond material such as to introduce isolated vacancies V into at least part of the provided CVD diamond material is such that the total concentration of isolated vacancies $[V_T]$ in the irradiated diamond material is at least the greater of (a) 0.5 ppm and (b) 50% higher than the $[N_s^0]$ concentration in ppm, so that there are sufficient excess isolated vacancies over and above those that combine to form NV centers, available to join together to form vacancy chains.

If there are no $N_s^0$ defects in the provided CVD diamond material (and provided there is no other un-compensated element such as boron present) then when the annealing step (iii) of the methods according to the invention is carried out the isolated vacancies formed during the irradiation step will start to group into vacancy chains immediately.

Any isolated vacancies remaining in the lattice typically result in a flatter UV-Visible ("UV-Vis") optical absorption spectrum, which typically results in a more grey diamond material. Therefore for some embodiments, the concentration of isolated vacancies after the annealing process is complete is substantially reduced, and may be minimized. For some embodiments, after the annealing process the total concentration of isolated vacancies is <0.3 ppm, optionally <0.2, optionally <0.1, or optionally <0.05 ppm for a 0.5 carat (ct) round brilliant cut (rbc or RBC).

For many embodiments, the optimum anneal its one that will produce the highest conversion of isolated vacancies to vacancy chains possible. Such embodiments may result in a vivid orange material, with a high C* value, typically C*>20.

Whilst not in the visible part of the spectra itself, an increase in absorption centered at 250 nm is characteristic of the orange coloration and the saturation of the orange color scales with this feature. Therefore, a measure of the vacancy chain concentration is the absorption at 250 nm. For some embodiments, after irradiation and annealing, for a 0.5 ct round brilliant cut diamond stone, the absorption at 250 nm when measured at room temperature is >5 cm$^{-1}$, optionally >7 cm$^{-1}$, optionally >10 cm$^{-1}$ when the spectra has been scaled to 0 cm$^{-1}$ at 800 nm. Those skilled in the art will know that vacancy concentrations will need to be altered for diamond stones with different path lengths to result in the stated the absorption coefficients.

An additional benefit to irradiating the CVD diamond material is typically the color of the material will be more stable to low-temperature annealing and exposure to UV light (energy having an energy of at least 5.5 eV) compared with untreated CVD diamond. This stabilization effect is discussed in GB application number 0911075.0 and U.S. application No. 61/220,663, both filed 26 Jun. 2009, and in GB application number 0917219.8 and U.S. application No. 61/247,735, both filed 1 Oct. 2009, the entire disclosures of which are incorporated herein by reference.

In some embodiments according to the invention the provided diamond material shows a measurable difference in at least one of its absorption characteristics in first and second states, the first state being after exposure to irradiation having an energy of at least 5.5 eV (typically UV light) and the second state being after thermal treatment at 798 K (525° C.), and after the irradiation and annealing steps of methods according to the invention, the change in color saturation value C* between the diamond material in the first and second states is reduced by at least 0.5. This color stabilization may sometimes occur after simply irradiating. Optionally, after the irradiation and annealing steps of methods according to the invention, the change in C* of the diamond material in the said first and second states is less than 1.

In general, the annealing step will be carried out after the irradiation step is complete. However, it is also envisaged that there may be some overlap of the irradiation and annealing processes, for example the annealing step may start before the irradiation step is complete, or the two processes may be carried out, and start and finish, at substantially the same time.

Typically annealing is carried out in an inert atmosphere e.g. an argon atmosphere or under vacuum. Annealing is typically carried out at <100 mBar.

The present invention also provides the diamond material whenever made by a method according to the first aspect of the invention.

A second aspect of the present invention provides a CVD diamond material which when in the form of a 0.5 carat RBC is graded fancy orange.

The terminology fancy orange diamond material is defined as diamonds which have a clear and distinct orange color (Diamond grading ABC The Manual, by Verena Pagel-Theisen, Rubin & Son, Belgium, 9$^{th}$ Edition, 2001, Page 67).

A third aspect of the present invention provides an orange CVD synthetic single crystal diamond having a hue angle in the range 69-90 for an equivalent 0.5 ct Round Brilliant Cut (RBC) diamond.

The perceived color of any particular diamond stone depends on the size and cut of the diamond. Therefore, where reference is given to the hue angle (which determines color), or to any color, it is usual in the field to quote this in terms of a standard size, usually 0.5 carat, and a standard cut, usually round brilliant cut (often known as RBC or rbc) diamond stone. For any given diamond stone, be it larger or smaller than 0.5 carat, or round brilliant cut or any other cut, models are available to adjust the color to that for the standard size and cut. Therefore, the provided diamond material used in the method according to the first aspect of the invention may have any size or cut, but color parameters where specified are adjusted to those for an equivalent material diamond stone of standard 0.5 carat size, and standard round brilliant cut for comparison of quoted values.

Embodiments of the invention may have one or more of the following color characteristics for an equivalent 0.5 ct Round Brilliant Cut (RBC) diamond stone.

TABLE 1

| Characteristic | Range |
| --- | --- |
| Hue angle α | 68°-90° |
| | optionally 69°-85° |
| | optionally 70°-80° |
| Saturation C * | 2-70 |
| | optionally 3-65 |
| | optionally 4-60 |
| Lightness L * | >45 |
| | optionally >50 |
| | optionally >55 |

Material of this invention can be differentiated from as grown orange material, which has had no treatment, by features that are introduced during the irradiation. These include small but measurable features in absorption or PL when measured at 77 K or below. For example features at 741 nm, 673 nm, 575 nm or 503 nm may be enhanced.

The color of the irradiated and annealed diamond can be quantified in a well established manner using "CIE L*a*b* Chromaticity Coordinates". The use of CIE L*a*b* Chromaticity Coordinates in diamond is described in WO 2004/022821, the entire disclosure of which is incorporated herein by reference. a* and b* are plotted as x and y axes of a graph and the hue angle is measured from the positive a* axis towards the positive b* axis. Thus a hue angle of greater than 90° and less than 180° lies in the upper left quadrant of the a*b* graph. In this scheme for describing color L* is the lightness and a fourth coordinate C* is the saturation.

The perceived color of an object depends on the transmittance/absorbance spectrum of the object, the spectral power distribution of the illumination source and the response curves of the observer's eyes. The CIE L*a*b* chromaticity coordinates (and therefore hue angles) quoted herein have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength $\lambda$,
$L_\lambda$=spectral power distribution of the illumination
$x_\lambda$=red response function of the eye
$y_\lambda$=green response function of the eye
$z_\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0=\Sigma_\lambda y_\lambda L_\lambda$
$L^*=116 (Y/Y_0)^{1/3}-16$=Lightness (for $Y/Y_0>0.008856$)
$a^*=500[(X/X_0)^{1/3}-(Y/Y_0)^{1/3}]$ (for $X/X_0>0.008856$, $Y/Y_0>0.008856$)
$b^*=200[(Y/Y_0)^{1/3}-(Z/Z_0)^{1/3}]$ (for $Z/Z_0>0.008856$)
$C^*=(a^{*2}+b^{*2})^{1/2}$=saturation
$h_{ab}$=arctan $(b^*/a^*)$=hue angle Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is standard to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIE L*a*b* coordinates for the new thickness. In this way the dependence of the hue, saturation and lightness on optical path length can be modeled to give an understanding of how the color of diamond with given absorption properties per unit thickness will depend on the optical path length.

L*, the lightness, forms the third dimension of the CIE L*a*b* color space. It is important to understand the way in which the lightness and saturation vary as the optical path length is changed for diamond with particular optical absorption properties. The method described in the preceding paragraph can also be used to predict how the L*C* coordinates of diamond with a given absorption coefficient spectrum depend on the optical path length.

The C* (saturation) numbers can be divided into saturation ranges of 10 C* units and assigned descriptive terms as below.

| | |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

Similarly the L* numbers can be divided up into lightness ranges as follows:

| | |
|---|---|
| 5-15 | very very dark |
| 15-25 | very dark |
| 25-35 | dark |
| 35-45 | medium/dark |
| 45-55 | medium |
| 55-65 | light/medium |
| 65-75 | light |
| 75-85 | very light |
| 85-95 | very very light |

There are four basic color tones defined by the following combinations of lightness and saturation:
Bright: Light and high saturation, Pale: Light and low saturation,
Deep: High saturation and dark, Dull: Low saturation and dark.

The stated hue angle, and a*, b*, C* and L* values provide a quantitative measure the quality and color of synthetic CVD diamond material of the present invention. These color properties may be advantageous because they give the diamond an orange color and can be used for ornamental purposes such as gemstones for jewelry, or for use as colored filters or similar.

For all samples used in this specification absorption peak heights quoted in this specification are measured using a UV/visible absorption spectrum of the synthetic CVD diamond material taken at room temperature.

All room temperature absorption spectra mentioned herein were collected using a Perkin Elmer Lambda-19 spectrometer. A reflection loss spectrum was created using tabulated refractive index data and standard expressions for the reflection loss for a parallel-sided plate. The refractive index was determined according to Peter's equation [Z. Phys., 15 (1923), 358-368)] and subsequent reflection loss derived using the standard Fresnel equation. The reflection loss spectrum was subtracted from the measured absorbance data and an absorption coefficient spectrum for the sample is created from the resulting spectrum. Absorption coefficient data were shifted so that absorption coefficient was zero at 800 nm.

Concentrations in ppm given in the present specification for the different defects, $[NV^{+/-}]$ and $[V^{0/-}]$, may be calculated in a known standard manner by integrating the area of peaks from the absorption spectrum of the diamond usually collected at liquid nitrogen temperatures and using published coefficients for comparison to calculate concentration. For concentrations of NV centers and isolated vacancies, the spectra are advantageously obtained at 77K, using liquid nitrogen to cool the samples, since at that temperature sharp peaks at ~741 nm and ~394 nm attributable to $V^0$ and $V^-$ and at 575 nm and 637 nm are seen attributable to $NV^0$ and $NV^-$ defects respectively. The coefficients that are used for the calculations of concentrations of NV centers and isolated vacancies in the present specification are those set out by G. Davies in Physica B, 273-274 (1999), 15-23, as detailed in Table 2 below.

TABLE 2

| Defect [label] | Calibration (meV cm$^{-1}$) |
|---|---|
| $V^-$ [ND1] | $A_{ND1} = (4.8 \pm 0.2) \times 10^{-16} [V^-]$ |
| $V^0$ [GR1] | $A_{GR1} = (1.2 \pm 0.3) \times 10^{-16} [V^0]$ |
| $NV^-$ | $A_{NV^-} = (1.4 \pm 0.35) \times 10^{-16} [NV^-]$ |
| $NV^0$ | $A_{NV^0} = (1.4 \pm 0.35) \times 10^{-16} [NV^0]$ |

In Table 2, "A" is the integrated absorption (meV cm$^{-1}$) in the zero phonon line of the transition, measured at 77 K, with the absorption coefficient in cm$^{-1}$ and the photon energy in meV. The concentration is in cm$^{-3}$.

The provided CVD diamond material used in the method according to the present invention, and also the irradiated CVD diamond material resulting from the method of the present invention may, or may not, form part of a larger piece of diamond material. For example part only of the larger piece of diamond material may be irradiated, and/or part only of the larger piece of diamond material may have the defined absorption characteristics. As would be apparent to the person skilled in the art multiple layers could also be irradiated and/or have the required absorption characteristics, so that the provided CVD diamond material used in the method according to the invention may form part, e.g. one or multiple layers of a larger piece of diamond material. It is well known that the depth of penetration of irradiation is dependent on the energy of the irradiation. So in certain embodiments an irradiation energy is selected such that the irradiation penetrates only part of the depth of a CVD diamond material. This means that isolated vacancies would be introduced only in the penetrated part of the irradiated CVD diamond material, and hence that penetrated part of the CVD diamond material would be the "diamond material" used formed by the method of the present invention.

Where the provided CVD diamond material provides only part of a larger piece of diamond material, as discussed above that provided CVD diamond material alone may have the advantageous optical properties described for certain embodiments of the invention. Thus for example a top or embedded layer or layers of a large piece of CVD diamond material may have an orange coloration. Where any other non-orange layers are substantially colorless the color of the larger piece of diamond material is dominated by the orange layer(s).

In some embodiments according to the invention at least 50% or at least 60% or at least 70% or at least 80% or at least 90% or substantially the whole diamond stone may have substantially the same color.

In other embodiments according to the invention of diamond stone may comprise layers or pockets of diamond material of the same color Embodiments of the invention will now be described, by way of example, with reference to the accompanying drawings and examples.

EXAMPLES

HPHT diamond substrates suitable for synthesizing single crystal CVD diamond of the invention were laser sawn, lapped into substrates, polished to minimize subsurface defects such that the density of defects is below 5×10$^3$/mm$^2$, and generally is below 10$^2$/mm. Polished HPHT plates 3.6 mm×3.6 mm square by 500 μm thick, with all faces {100} having a surface roughness R$_Q$ at this stage of less than 1 nm were mounted on a refractory metal disk, and introduced into a CVD diamond growing reactor.

Growth Stages
1) The CVD diamond reactor was pre-fitted with point of use purifiers, reducing unintentional contaminant species in the incoming gas stream to below 80 ppb.
2) An in situ oxygen plasma etch was performed using 50/40/3000 sccm (standard cubic centimeter per second) of O$_2$/Ar/H$_2$ and a substrate temperature of 760° C.
3) This moved without interruption into a hydrogen etch with the removal of the O$_2$ from the gas flow.
4) This moved into the growth process by the addition of the carbon source (in this case CH$_4$) and dopant gases. For these examples the CH$_4$ flowing at 165 sccm, nitrogen was present in the process gas at different levels for the different samples, provided from a calibrated source for example 100 ppb N$_2$ either as Air in Ar or N$_2$ in H$_2$, and for some examples O$_2$ was also present in the process gas as shown in Table 3.

TABLE 3

| Example | Nitrogen dopant present in the process gas (ppm) | Oxygen flow present in the process gas (ppm) |
| --- | --- | --- |
| 1 and 2 | 0.7 | 0 |
| 3 | 1.8 | 9160 |
| 4-6 | 1.1 | 13657 |

5) On completion of the growth period, the substrate was removed from the reactor and the CVD diamond layer removed from the substrate by laser sawing and mechanical polishing techniques.
6) This produced a CVD sample which had typical dimensions ~3.1×5×5 mm.

This grown CVD diamond is the "provided diamond" that is irradiated by methods of the present specification.

The examples were electron irradiated a 4.5 MeV electron beam at 50% scan width and 20 mA beam current using an electron beam source such as that found at Isotron plc. Diamond samples to be irradiated are mounted in indium on a water cooled copper block to prevent the samples being heated above 350 K. The samples were then annealed in an Elite tube furnace (model THS 16/50/180-2416CG and 27160/T). Typically to make an orange diamond material a dose of 5.8×10$^{18}$ e$^-$/cm$^2$ (equivalent to 6 hours irradiation with a 4.5 MeV electron beam at 50% scan width and 20 mA beam current) followed by an 8 hour anneal at 800° C. was used.

Figure 1:
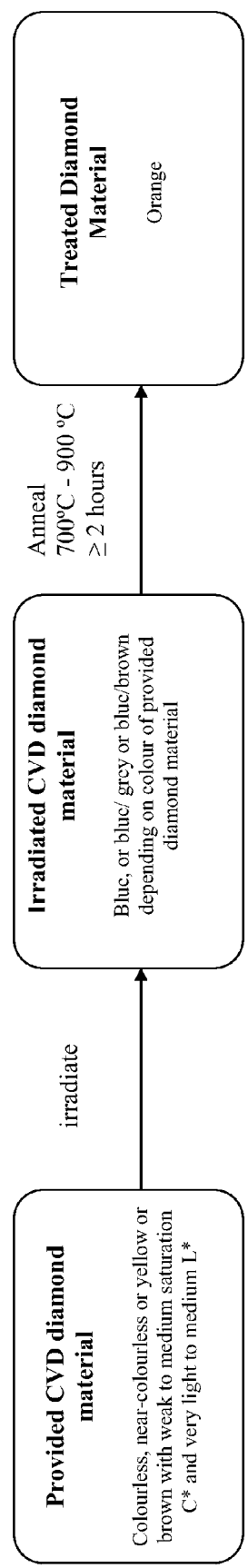
FIG. 1, which has been referred to hereinbefore, is a flow chart which shows routes for methods according to the invention for obtaining orange diamond material.
Figure 2:
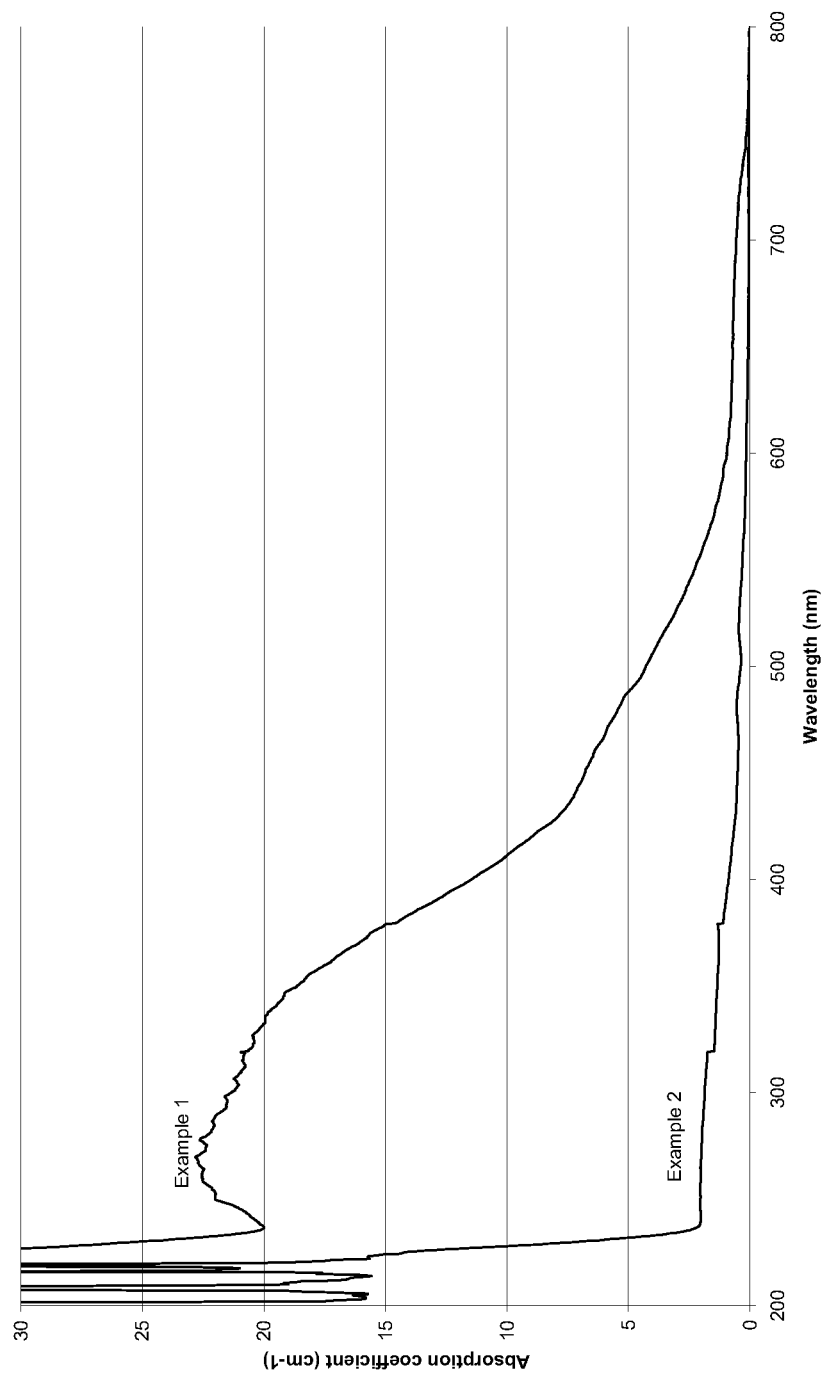
FIG. 2 are UV visible absorption spectra measured at room temperature for examples 1 and 2, post irradiation and anneal.

Table 4 records the CVD growth chemistry, the [N$_s^0$] concentration in the provided diamond material, the absorption coefficients at 350 nm and 510 nm and the color, of the provided diamond material, the irradiation dose, the vacancy concentration post irradiation, the annealing time and temperature, the color of the diamond material post irradiation and anneal, the color characteristics, the [NV], [V$^0$] and [V$^-$] concentrations and the absorption at 250 nm related to vacancy chains, all post irradiation and anneal. The results table 4 includes not only examples falling within the scope of the present invention, but also a number of comparative examples. For example, if the irradiation dose is not high enough, the number of isolated vacancies available to combine to form chains upon annealing, irrespective of the length of the anneal will not be large enough to form a significant concentration of vacancy chains; this is the case for comparative examples 2 and 6, which fall outside the scope of the present invention as the concentration of isolated vacancies incorporated during the irradiation step is less than the greater of (a) 0.5 ppm and (b) 0.5 ppm more than the [$N_s^0$] concentration, and the absorption at 250 nm in the treated sample is <5 cm$^{-1}$. This is also illustrated with reference to FIG. 2 which is a room temperature UV visible absorption spectrum for examples 1 and 2, post irradiation and anneal. This figure shows strong absorption at 250 nm for example 1, indicating the presence of vacancy chains, whereas in example 2 the absorption in the 250 nm range is less than 5 cm$^{-1}$, showing a low concentration of vacancy chains has been formed. Similarly we have found that if the annealing time is not long enough then total concentration of isolated vacancies remaining in the treated sample is >0.3 ppm; this is the case in comparative example 5, which is annealed for only 1 hour and results in a grey colored diamond material as compared with the orange color achieved with example 4, which is an identical diamond material sample to that of example 5 in terms of composition and irradiation, but is annealed for a longer time.

Figure 3:
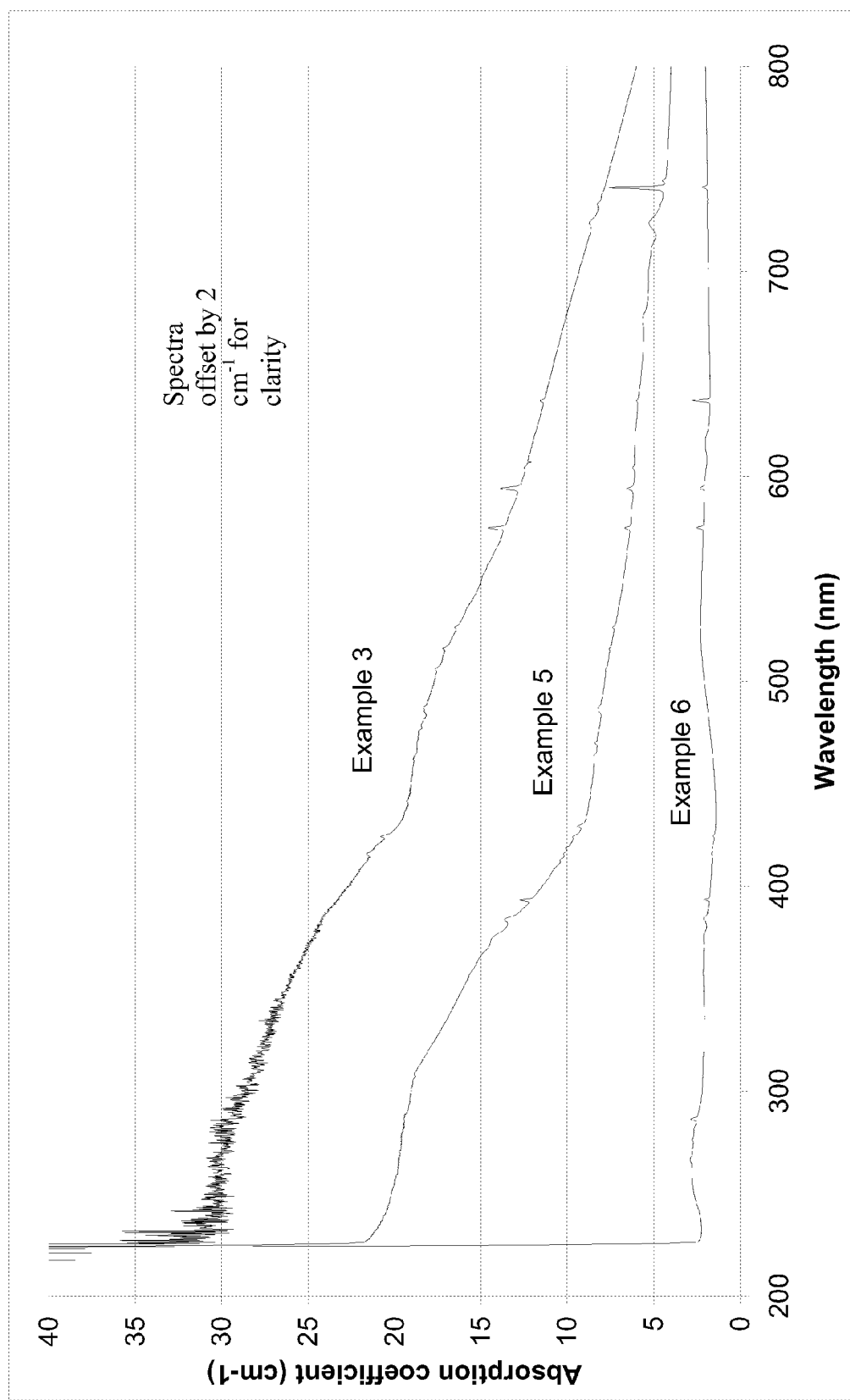
FIG. 3 are UV Visible absorption spectra measured at 77 K for examples 3, 5 and 6 post irradiation and anneal.

FIG. 3 which shows UV visible spectra taken at 77 K post irradiation and anneal and illustrates for example 3 strong absorption at 250 nm and no peak at 741 nm or 394 nm remaining, showing that substantially all of the isolated vacancies have been annealed out. FIG. 3 also illustrates why comparative example 5 (which has been annealed for an insufficient time) appears grey post irradiation and anneal since there are peaks at 741 nm and 394 nm indicating the presence of isolated vacancies and also at 575 nm and 637 nm showing the presence of NV centers. Similarly FIG. 3 illustrates why comparative example 6 (which has been subjected to insufficient irradiation dose) appears pale pink, since there are peaks at 575 nm and 637 nm, showing the presence of NV centers, a small concentration of isolated vacancies remaining, and weak absorption at 250 nm indicating a low concentration of vacancy chains.

All of the orange diamond samples according to the invention (examples 1, 3 and 4, show strong absorption at around 250 nm. This absorption is believed to be due to the presence of vacancy chains. For example, the measured absorption at 250 nm is >5 cm$^{-1}$ for both samples 1 and 3, whereas for comparative sample 2 it is <5 cm$^{-1}$.

As noted above an additional benefit of irradiating the CVD diamond material is that typically the color of the material will be more stable to low temperature annealing and exposure to UV light compared to untreated CVD diamond. We found that upon heating example 1 the change in C* between the two states was <1 which illustrates this benefit.

TABLE 4

| Example Number | CVD Growth chemistry | $N_s^0$ conc. in provided CVD diamond (ppm) | Abs at 350 nm | Abs at 510 nm | Color in the provided diamond pre-irradiation (Color grade if 0.5 ct RBC) | Irradiation dose (e/cm$^2$) | Vacancy concentration post irradiation (ppm) | Anneal time and temperature (hours) (°C.) | Observed color of diamond after irradiation and annealing |
|---|---|---|---|---|---|---|---|---|---|
| 1 | Traditional CVD growth process | 0.1 | 1.09 | 0.45 | Colorless | 5.8 × 10$^{18}$ | V$^0$ = 1.41<br>V$^-$ = 0.03 | 8 hrs at 800° C. | Bright vivid orange |
| 2* | Traditional CVD growth process | 0.1 | 1.09 | 0.45 | Colorless | 2.6 × 10$^{17}$ | V$^0$ = 0.17<br>V$^-$ = 0.033 | 8 hrs at 800° C. | Dull pinkish brown |
| 3 | Added oxygen CVD growth process | 0.6 | 1.85 | 0.60 | Pale yellow | 3.9 × 10$^{18}$ | V$^0$ = 1.95<br>V$^-$ = 0.23 | 8 hrs at 800° C. | Bright vivid orange |
| 4 | Added oxygen CVD growth process | 0.35 | 1.42 | 0.63 | Pale yellow | 2 × 10$^{18}$ | V$^0$ = 1.1<br>V$^-$ = 0.3 | 8 hrs at 800° C. | Orange-pink |
| 5* | Added oxygen CVD growth process | 0.35 | 1.42 | 0.63 | Pale yellow | 2 × 10$^{18}$ | V$^0$ = 1.1<br>V$^-$ = 0.3 | 1 hr at 800° C. | Grey |
| 6* | Added oxygen CVD growth process | 0.35 | 1.42 | 0.63 | Pale yellow | 2.6 × 10$^{17}$ | V$^0$ = 0.06<br>V$^-$ = 0.12 | 8 hrs at 800° C. | Pale pink |

| Example Number | CVD Growth chemistry | Color characteristics L* C* α | [NV] concentration (ppm) Post irradiation and anneal | [V$^0$] and [V$^0$] concentration (ppm) Post irradiation and anneal | Absorption at 250 nm related to vacancy chains at RT Post irradiation and anneal |
|---|---|---|---|---|---|
| 1 | Traditional CVD growth process | L* = 63.1<br>C* = 52.6<br>α = 78.2° | NV$^0$ = 0.035<br>NV$^-$ = 0.0004 | V$^0$ = <0.003<br>V$^-$ = <0.003 | 22.01 |

TABLE 4-continued

| | | | | | |
|---|---|---|---|---|---|
| 2* | Traditional CVD growth process | $L^* = 80.2$<br>$C^* = 5.05$<br>$\alpha = 67.7°$ | $NV^0 = 0.031$<br>$NV^- = 0.0086$ | $V^0 = <0.046$<br>$V^- = <0.0086$ | 2.04 |
| 3 | Added oxygen CVD growth process | $L^* = 59.1$<br>$C^* = 34.4$<br>$\alpha = 70.7°$ | $NV^0 = 0.19$<br>$NV^- = 0.038$ | $V^0 = <0.003$<br>$V^- = <0.003$ | 13.74 |
| 4 | Added oxygen CVD growth process | $L^* = 70.5$<br>$C^* = 17.08$<br>$\alpha = 71.7°$ | $NV^0 = 0.092$<br>$NV^- = 0.019$ | $V^0 = 0.21$<br>$V^- = 0.034$ | 7.8 |
| 5* | Added oxygen CVD growth process | $L^* = 69.3$<br>$C^* = 10.8$<br>$\alpha = 83.3°$ | $NV^0 = 0.055$<br>$NV^- = 0.019$ | $V^0 = 0.45$<br>$V^- = 0.053$ | 8.71 |
| 6* | Added oxygen CVD growth process | $L^* = 87.4$<br>$C^* = 4.26$<br>$\alpha = 44.93°$ | $NV^0 = 0.078$<br>$NV^- = 0.14$ | $V^0 = 0.041$<br>$V^- = 0.044$ | 3.01 |

The invention claimed is:

1. CVD diamond material graded fancy orange, wherein the concentration of isolated vacancies is <0.3 ppm, wherein the CVD diamond material has a single substitutional nitrogen content of less than 1 ppm, and wherein an absorption at 250 nm in an absorption spectrum measured at room temperature is >5 cm$^{-1}$ when the absorption spectrum has been scaled to 0 cm$^{-1}$ at 800 nm.

2. CVD synthetic single crystal diamond material according to claim 1, having the following color characteristics:

| Characteristic | Range |
|---|---|
| Hue angle $\alpha$ | 68°-90° |
| Saturation C* | 2-70 |
| Lightness L* | >45. |

3. CVD diamond material according to claim 1, wherein a change in saturation C* of the CVD diamond material in first and second states is less than 1, the first state being after exposure to irradiation having an energy of at least 5.5 eV and the second state being after thermal treatment at 798 K (525° C.).

4. Jewelry comprising the CVD diamond material according to claim 1 and a setting for the CVD diamond material.

5. A round brilliant cut diamond gemstone comprising CVD diamond material according to claim 1.

* * * * *